United States Patent
Wu et al.

(10) Patent No.: US 6,730,556 B2
(45) Date of Patent: May 4, 2004

(54) COMPLEMENTARY TRANSISTORS WITH CONTROLLED DRAIN EXTENSION OVERLAP

(75) Inventors: Zhiqiang Wu, Plano, TX (US); Che-Jen Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/313,357

(22) Filed: Dec. 6, 2002

(65) Prior Publication Data

US 2003/0107104 A1 Jun. 12, 2003

Related U.S. Application Data

(60) Provisional application No. 60/339,621, filed on Dec. 12, 2001.

(51) Int. Cl.[7] ................... H01L 21/8238; H01L 21/336
(52) U.S. Cl. .............. 438/230; 438/231; 438/303; 438/305; 438/595
(58) Field of Search .................. 438/230, 231, 438/303, 305, 595

(56) References Cited

U.S. PATENT DOCUMENTS

| | | | | |
|---|---|---|---|---|
| 4,757,026 A | * | 7/1988 | Woo et al. | 438/231 |
| 4,818,714 A | * | 4/1989 | Haskell | 438/231 |
| 5,010,030 A | * | 4/1991 | Pfiester et al. | 438/231 |
| 5,021,354 A | * | 6/1991 | Pfiester | 438/230 |
| 5,024,959 A | * | 6/1991 | Pfiester | 438/231 |
| 5,254,866 A | * | 10/1993 | Ogoh | 257/369 |
| 5,654,212 A | * | 8/1997 | Jang | 438/231 |
| 5,696,012 A | * | 12/1997 | Son | 438/231 |
| 5,736,446 A | * | 4/1998 | Wu | 438/305 |
| 5,766,991 A | * | 6/1998 | Chen | 438/231 |
| 5,882,973 A | * | 3/1999 | Gardner et al. | 438/279 |
| 5,976,939 A | * | 11/1999 | Thompson et al. | 438/305 |
| 6,046,089 A | * | 4/2000 | Gardner et al. | 438/303 |
| 6,316,304 B1 | * | 11/2001 | Pradeep et al. | 438/230 |
| 6,344,388 B1 | * | 2/2002 | Oishi et al. | 438/241 |
| 6,344,398 B1 | * | 2/2002 | Hsu | 438/303 |
| 6,489,207 B2 | * | 12/2002 | Furukawa et al. | 438/301 |
| 6,506,642 B1 | * | 1/2003 | Luning et al. | 438/231 |

* cited by examiner

Primary Examiner—Amir Zarabian
Assistant Examiner—Toniae M. Thomas
(74) Attorney, Agent, or Firm—Yingsheng Tung; Wade James Brady, III; Frederick J. Telecky, Jr.

(57) ABSTRACT

An integrated circuit device (60) including a first transistor (PMOS) of a first conductivity type and a second transistor (NMOS) of a second conductivity type that is complementary to the first conductivity type. The method includes the steps of forming a first gate stack (100), the first transistor including the first gate stack and forming a second gate stack (80), the second transistor including the second gate stack. The method further includes implanting a first drain extension region (107) at a first distance relative to the first gate stack, the first transistor including the first drain extension region, and the method includes implanting a second drain extension region (87) at a second distance relative to the second gate stack, the second transistor including the second drain extension region. The first distance is greater than the second distance.

4 Claims, 4 Drawing Sheets

COMPLEMENTARY TRANSISTORS WITH CONTROLLED DRAIN EXTENSION OVERLAP

CROSS-REFERENCES TO RELATED APPLICATIONS

This application claims priority under 35 USC 119(e)(1) of provisional application No. 60/339,621 filed Dec. 12, 2001.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to electronic circuit transistors having drain extensions.

Semiconductor devices are prevalent in all aspects of electronic circuits, and the design of such devices often involves a choice from various circuit elements such as one or more different transistor devices. For example, in various applications including many high performance applications, transistors are formed with so-called drain extensions that are so named because they extend the source/drain regions of the transistor to the area under the transistor gate. Several years ago such extensions were formed in some applications using "lightly-doped drain" extensions, typically identified with the abbreviation LDD. More recently, a comparable structure has been formed, but the amount of dopant concentration in what formerly were the LDD regions has increased. As a result, these regions are more recently referred to as HDD regions due to the higher dopant concentration.

By way of further background, the following Figures and discussion illustrate one prior art approach for forming a PMOS transistor and an NMOS transistor, both including HDD regions. Looking to FIG. 1a, it illustrates a cross-sectional view of an integrated circuit semiconductor device designated generally at 10 and which is built in connection with a substrate 12. By way of example, substrate 12 is a p-type semiconductor material. Relative to substrate 12, two areas 14 and 16 are shown in which an NMOS and PMOS transistor, respectively, are to be formed. Generally, areas 14 and 16 are isolated from one another, such as through the use of an isolating region 18, typically formed from oxide. Looking to area 14, a gate stack 20 is formed with a gate insulator 22 separating a gate 24 from substrate 12. Similarly and looking to area 16, a gate stack 40 is formed with a gate insulator 42 separating a gate 44 from an n-type well 12' formed within substrate 12. After each gate stack is formed, respective sidewall spacers 25 and 45 are formed along the sidewalls of each stack 20 and 40, respectively, such as by forming a layer of conformal oxide over the structure and then etching it to leave oxide spacers along the sidewalls of each gate stack. Once sidewall spacers 25 and 45 are formed for both transistors, at one time one transistor area is masked while a dopant implant is performed for the un-masked transistor and, thereafter, the masking process is reversed and the implant is performed for the other transistor. For example, assume in a first instance that area 16 is masked, and then an n-type dopant, such as arsenic, is implanted in area 14. This n-type implant forms HDD regions 26 that self-align with respect to sidewall spacers 25. Next, in a second instance, area 14 is masked, and then a p-type dopant is implanted in area 16. In the prior art, one common p-type dopant has been boron, and more recently favor has been found in the use of $BF_2$ rather than boron alone. This p-type implant forms HDD 46 regions that self-align with respect to sidewall spacers 45.

FIG. 1b illustrates device 10 after additional processing. Specifically, after the steps shown in FIG. 1a, an anneal is performed. The annealing step activates the dopants in HDD regions 26 and 46. In response to the anneal, the dopants in HDD regions 26 and 46 tend to migrate laterally, that is, the dopant profile in each of regions 26 and 46 causes a migration in response to the anneal. As a result, in FIG. 1b note that regions 26 and 46 are now labeled 26' and 46' to distinguish them from FIG. 1a, where the distinction is helpful because it represents that each HDD region has encroached laterally under its respective gate stack.

FIG. 1c illustrates device 10 after additional processing. Specifically, after the steps shown in FIG. 1b, additional respective sidewall spacers 28 and 48 are formed along the sidewall spacers 25 and 45 of each transistor, respectively. Spacers 28 and 48 also may be formed by forming a layer of conformal oxide over the structure and then etching it to leave oxide spacers along the previously-formed sidewalls of each gate stack. Once sidewall spacers 28 and 48 are formed for both gate stacks 20 and 40, at one time one transistor area is masked while a dopant implant is performed for the un-masked transistor and, thereafter, the mask process is reversed and the implant is performed for the other transistor. For example, assume in a first instance that area 16 is masked, and then an n-type dopant (e.g., arsenic) is implanted in area 14. This n-type implant forms deep source/drain regions 30 that self-align with respect to sidewall spacers 28. Next, in a second instance, area 14 is masked, and thereafter a p type dopant (e.g., BF2) is implanted in area 16. This p-type implant forms deep source/drain regions 50 that self align with respect to sidewall spacers 48.

FIG. 1d illustrates device 10 after additional processing. Specifically, after the steps shown in FIG. 1c, an additional anneal is performed. The annealing step activates the dopants in deep source/drain regions 30 and 50. In response to the anneal, the dopant profiles of source/drain regions 30 and 50 are such that source/drain regions 30 and 50 migrate laterally and they also further combine with HDD regions 26' and 46', respectively. As a result, in FIG. 1d the combined regions are shown for the NMOS transistor and the PMOS transistor as 32 and 52, respectively. Lastly, following the preceding steps, various other steps may be taken to form other aspects with respect to the PMOS and NMOS transistors, including other layers for connectivity and the like.

While device 10 has performed adequately in many circuits and applications, it has been observed in connection with the present embodiments that device 10 may provide drawbacks. Specifically, in many device fabrication processes it is desirable to have certain comparable aspects for both PMOS and NMOS devices. In the case of device 10, one such instance of this principle arises with respect to what is referred to as the "overlap" between each HDD region and the adjacent sidewall of its corresponding gate 24 or 44. Returning briefly to FIG. 1d, such an overlap is shown for each transistor, with the NMOS transistor having an overlap $OV1_N$ and the PMOS transistor having an overlap $OV1_P$. Returning to the above-introduced principle of comparable transistor aspects, it is therefore desirable that the length of overlap $OV1_N$ and overlap $OV1_P$ are the same or very similar. This is desirable, for example, because the amount of overlap may affect the operational characteristics of each device, where typically it is desirable that the PMOS and NMOS transistors have certain characteristics (in complementary fashion) that are the same or very similar.

Given the above, the present inventors recognize that the process of FIGS. 1a through 1d does not necessarily provide equal values for overlaps $OV1_N$ and $OV1_P$. Specifically, it is observed that the arsenic, used for the n-type implant, diffuses in response to an anneal at a slower rate than the $BF_2$, used for the p-type implant. As a result, if the same dosage and energies are used for both the arsenic and $BF_2$ implants, then overlaps $OV1_N$ and $OV1_P$, caused by the anneal, are unequal. To compensate for this variance, one approach in the prior art has been to lower the dose (or energy) used in the $BF_2$ implant that forms HDD regions 46 in the PMOS transistor as compared to the dose (or energy) used in the arsenic implant that forms HDD regions 26 in the NMOS transistor. Still further, however, this alternative is also observed to provide a drawback. Specifically, by lowering the dose and/or energy of the $BF_2$ implant, the source/drain resistance, commonly designated $R_{SD}$, for the PMOS transistor is increased. Source/drain resistance is typically considered the resistance between the source/drain contact (not shown) and the interface between the HDD region and the transistor channel. When the $R_{SD}$ of the PMOS transistor is increased, it then results in reduced drive current and reduced circuit speed performance, which are undesirable.

In view of the above, there arises a need to address the drawbacks of the prior art, as is achieved by the preferred embodiments described below.

BRIEF SUMMARY OF THE INVENTION

In the preferred embodiment, there is an integrated circuit device comprising a first transistor of a first conductivity type and a second transistor of a second conductivity type that is complementary to the first conductivity type. The method comprises the steps of forming a first gate stack, the first transistor comprising the first gate stack. The method further comprises forming a second gate stack, the second transistor comprising the second gate stack. The method further comprises implanting a first drain extension region at a first distance relative to the first gate stack, the first transistor comprising the first drain extension region, and the method comprises implanting a second drain extension region at a second distance relative to the second gate stack, the second transistor comprising the second drain extension region. The first distance is greater than the second distance. Other methods and devices are also disclosed and claimed.

DETAILED DESCRIPTION OF THE INVENTION

FIGS. 1a through 1d were discussed above in the Background Of The Invention section of this document and the reader is assumed familiar with the principles of that discussion.

Figure 1A:
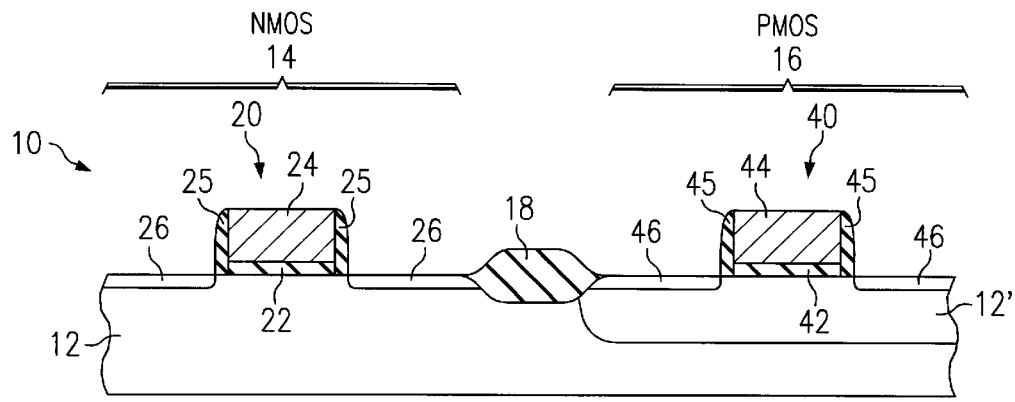
FIG. 1a illustrates a cross-sectional view of a prior art integrated circuit semiconductor device including an NMOS and PMOS gate stack, each having respective HDD regions.
Figure 1B:
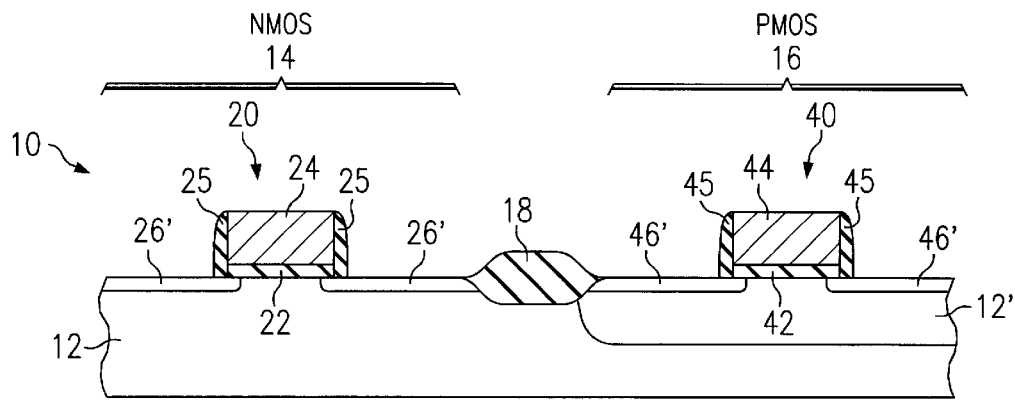
FIG. 1b illustrates the prior art semiconductor device of FIG. 1a after an anneal of the HDD regions.
Figure 1C:
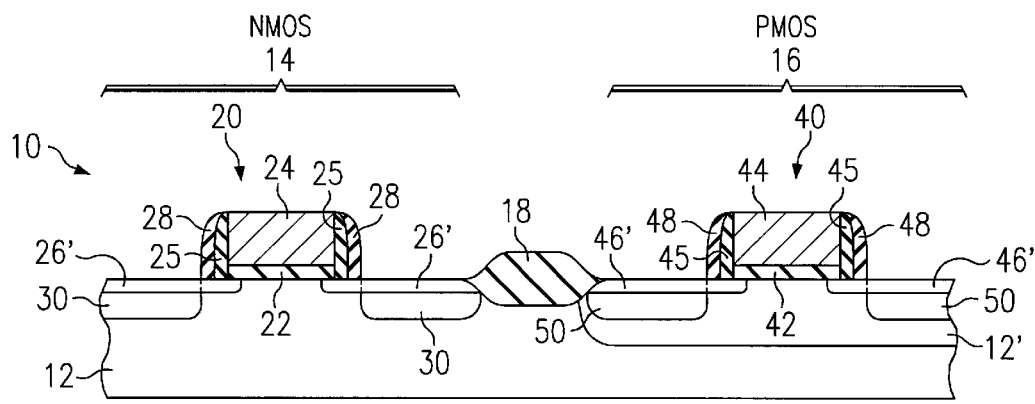
FIG. 1c illustrates the prior art semiconductor device of FIG. 1b after an implant of deep source/drain regions.
Figure 1D:
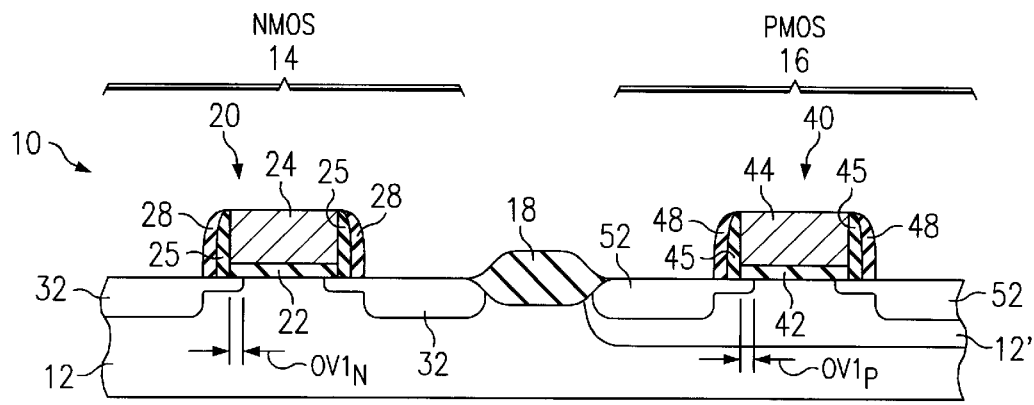
FIG. 1d illustrates the prior art semiconductor device of FIG. 1c after an anneal of the deep source/drain regions.
Figure 2A:
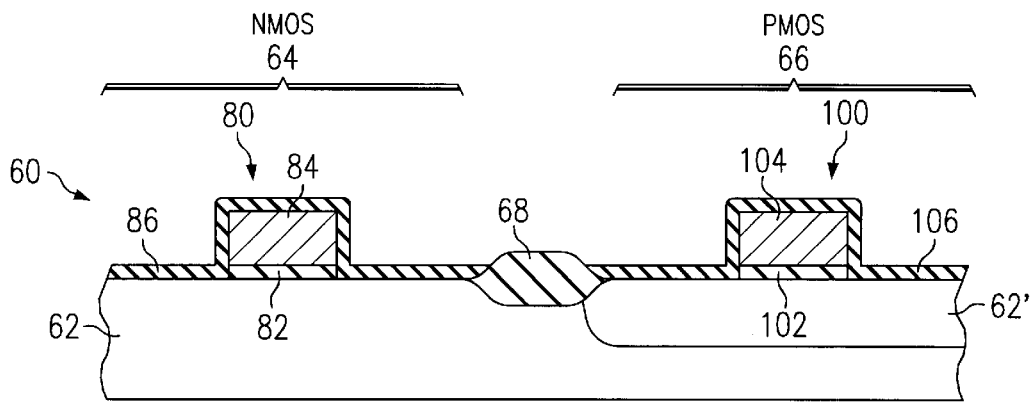
FIG. 2a illustrates a cross-sectional view of a preferred embodiment integrated circuit semiconductor device.

FIG. 2a illustrates a cross-sectional view of an integrated circuit semiconductor device designated generally at 60 and which is formed according to the preferred embodiment. Device 60 is constructed in connection with a substrate 62, where by way of example substrate 62 is a p-type semiconductor material and includes an n-type well 62', although alternative underlying regions could support the transistors described below. Relative to substrate 62, two areas 64 and 66 are shown in which an NMOS and PMOS transistor, respectively, are to be formed. Generally, areas 64 and 66 are isolated from one another, such as through the use of an isolating region 68, typically formed from oxide. Looking to area 64, a gate stack 80 is formed with a gate insulator 82 separating a polysilicon gate 84 from substrate 62. Similarly and looking to area 66, a gate stack 100 is formed with a gate insulator 102 separating a polysilicon gate 104 from n-type well 62'. First insulating layers 86 and 106 are formed over each gate stack 80 and 100, respectively. In the preferred embodiment, first insulating layers 86 and 106 are formed at the same time by performing a re-oxidation of device 60. The re-oxidizing step may be performed, by way of example, by subjecting device 60 to an oxidizing ambient, at a temperature on the order of 800° C. for up to 10 minutes. The re-oxidation causes the formation of an oxide along the exposed semiconductor components. Typically, the formation along polysilicon gates 84 and 104 will be slightly thicker than along substrate 62 (or well 62'), where by way of example the growth of layers 86 and 106 is preferably on the order of 20 to 40 Angstroms.

Figure 2B:
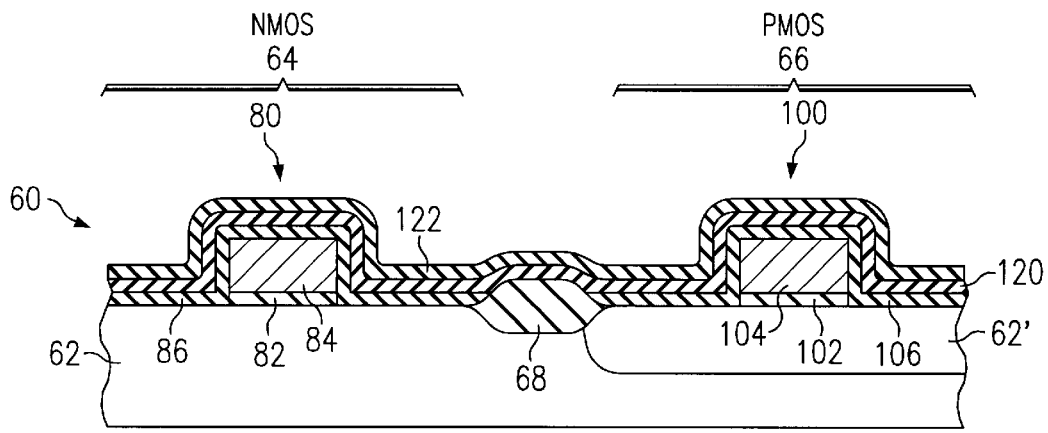
FIG. 2b illustrates the semiconductor device of FIG. 2a after the formation of three insulating layers over the gate stacks.

FIG. 2b illustrates device 60 after the formation steps shown in FIG. 2a, and in FIG. 2b a second insulating layer 120 is formed. In the preferred embodiment, second insulating layer 120 is a nitride layer that is deposited as a conformal layer on the order of 40 Angstroms thick and preferably over the entirety of device 60. Thereafter, a third insulating layer 122 is formed. In the preferred embodiment, third insulating layer 122 is an oxide layer, where this layer is deposited as opposed to the grown oxide that forms first insulating layers 86 and 106. Thus, third insulating layer 122 is a conformal layer, and preferably it is deposited on the order of 40 Angstroms thick over the entirety of device 60. One type of technique that is readily implemented for forming third insulating layer 122 is the TEOS approach as known in the art.

Figure 2C:
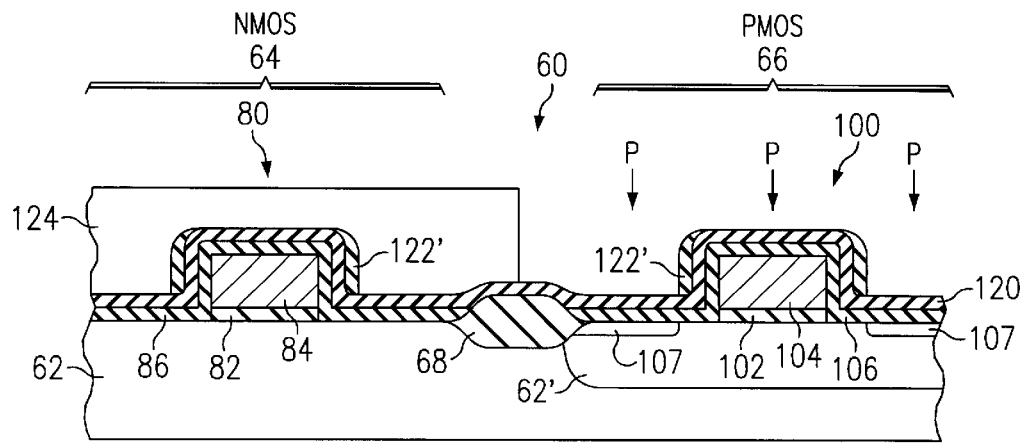
FIG. 2c illustrates the semiconductor device of FIG. 2b after the formation of insulating sidewall spacers from the top layer of the three insulating layers in FIG. 2b and following an implant of p-type HDD regions.

FIG. 2c illustrates device 60 after the formation steps shown in FIG. 2b. First, an anisotropic etch is performed, preferably as a dry etch, relative to third insulating layer 122 in FIG. 2b; as a result, third insulating layer 122 remains only along the sidewalls of gates 84 and 104, which therefore in FIG. 2c are shown to have sidewall spacers 122' which represent the remaining portions of layer 122 following this anisotropic etch. Next and as shown in FIG. 2c, a mask 124 is formed in area 64 and, thus, over the region in which the NMOS transistor is being formed. Next, a p-type dopant implant is performed which thereby applies those dopants in area 66. In the preferred embodiment, the p-type dopant is $BF_2$, and it is implanted at an energy on the order of 15 keV and at a concentration on the order of $1E^{15}/cm^2$ to $2E^{15}/cm^2$. As a result, this p-type implant passes through layers 120 and 106 and causes HDD 107 regions to form within well 62' and self-aligned with respect to the thickness of sidewall spacers 122' as they conform to the sidewalls of gate 104.

Figure 2D:
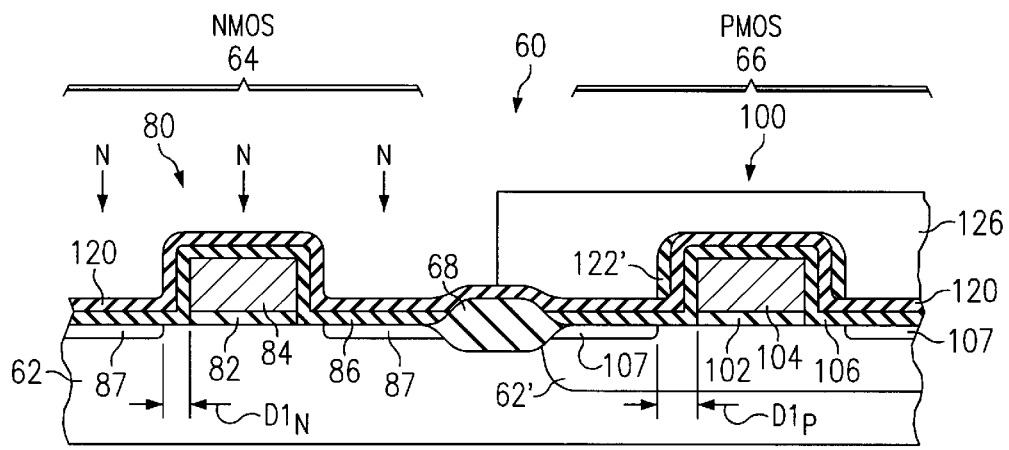
FIG. 2d illustrates the semiconductor device of FIG. 2c after the removal of one set of sidewall spacers for the NMOS transistor and the implant of n-type HDD regions.

FIG. 2d illustrates device 60 after the formation steps shown in FIG. 2c, and in FIG. 2d mask 124 is removed from area 64 and a mask 126 is formed in area 66. Thereafter, an isotropic etch is performed, where the etch is selective to remove the sidewall spacers 122' adjacent gate 84, that is, in the un-masked portion of device 60; this etch also removes very little, if any, of the nitride of second insulating layer 120 since any such etch of that second insulating layer 120 will be much slower than the etch of sidewall spacers 122'. For example, the etch may be achieved using a wet etch process, such as through a dilute HF mixture. As a result, therefore, sidewall spacers 122' are removed in area 64. Thereafter, an n-type dopant implant is performed which thereby applies those dopants in area 64. In the preferred embodiment, the n-type dopant is arsenic, and it is implanted at an energy on the order of 8 keV and at a concentration on the order of $1E^{15}/cm^2$ to $2E^{15}/cm^2$. As a result, this n-type implant passes through layers 120 and 86 (which is the same layer thickness as for layers 120 and 106 through which the p-type implant of FIG. 2c passed) and causes HDD 87 regions to form within substrate 62 and that are self-aligned with respect to the thickness of second insulating layer 120 as it conforms to the sidewalls of gate 84.

Before proceeding, additional attention is directed to two relative physical dimensions in FIG. 2d as they relate to the implants of HDD regions 107 and 87. Specifically, in FIG. 2d, a horizontal distance $D1_P$ is defined for the PMOS transistor between the sidewall of gate 104 and the inner lateral side of HDD region 107, and similarly a horizontal distance $D1_N$ is defined for the NMOS transistor between the sidewall of gate 84 and the inner lateral side of HDD region 87. As shown, $D1_P$ exceeds $D1_N$, and one skilled in the art should appreciate that this relative difference exists due to the removal of sidewall spacers 122' in area 64 prior to the formation of HDD regions 87. In other words, with respect to area 66, HDD regions 107 are formed at a time when gate 104 has three different insulating layers, 106, 120, and 122 (where layer 122 is then in the form of sidewall spacers 122'), along its sidewalls; as a result $D1_P$ is defined according to the combined thickness of those layers along each sidewall of gate 104. In contrast, HDD regions 87 are formed at a time when gate 84 has two different insulating layers, 106 and 120, along its sidewalls, and as a result $D1_N$ is a shorter distance that is defined according to the combined thickness of those layers along each sidewall of gate 84. The effects and benefits of the difference between $D1_P$ and $D1_N$ are further appreciated below.

Figure 2E:
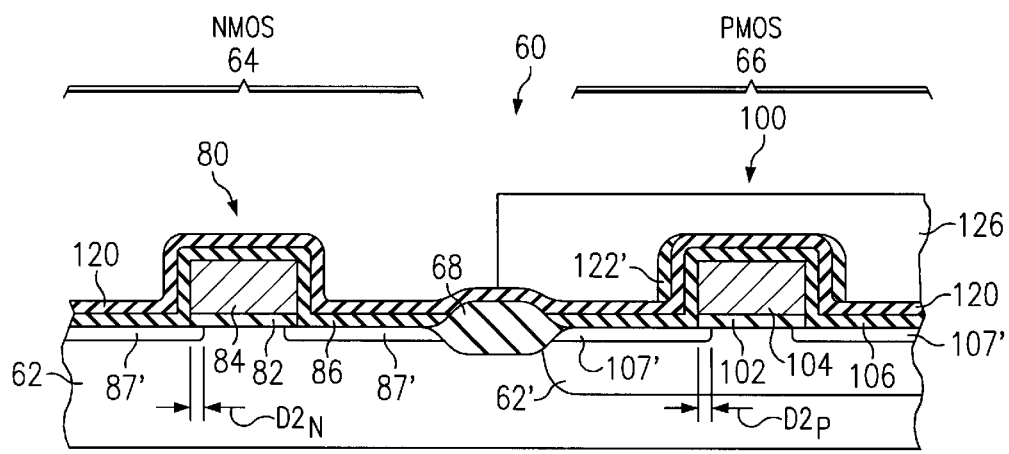
FIG. 2e illustrates the semiconductor device of FIG. 2d after an anneal of the p-type and n-type HDD regions.

FIG. 2e illustrates device 60 after the formation steps shown in FIG. 2d, and in FIG. 2e an anneal is performed. The annealing step activates the dopants in HDD regions 87 and 107 of FIG. 2d. The anneal step may be achieved using various parameters, such as a rapid thermal anneal ("RTA") at 950° C. and for a desirable amount of time such as on the order of one second to one minute. As in the case of the prior art in general, the anneal causes the dopants in HDD regions 87 and 107 to migrate laterally and, thus, those regions in FIG. 2e are labeled 87' and 107' so as to distinguish them from their form prior to the anneal. In connection with the extent of the lateral migration of HDD regions 87' and 107', recall from FIG. 2d that $D1_P$ is greater than $D1_N$. In other words, these relative dimensions indicate that, prior to the anneal step of FIG. 2e, HDD regions 87' are closer to gate 84 than HDD regions 107' are to gate 104. Recall further that, in the preferred embodiments, HDD regions 107' are formed from $BF_2$ which provides a dopant that diffuses faster than the arsenic used to form HDD regions 87'. Thus, in response to the anneal of FIG. 2e, HDD regions 107' move a greater distance in the lateral direction toward gate 104 in comparison to the lateral movement of HDD regions 87' toward gate 84, but because HDD regions 87' are initially located closer to gate 84, then at the conclusion of the anneal both sets of HDD regions 87' and 107' extend a comparable distance under their respective gates; this aspect is shown in FIG. 2e in which the distance of extension for HDD regions 87' under gate 84 is shown as $D2_N$ and the distance of extension for HDD regions 107' under gate 104 is shown as $D2_P$. As a result of the anneal, therefore, $D2_N$ and $D2_P$ are approximately the same dimension. Additionally, note that the distances $D2_N$ and $D2_P$ also may be affected by later processing steps, such as in connection with a later anneal of deep source/drain regions as discussed below.

Figure 2F:
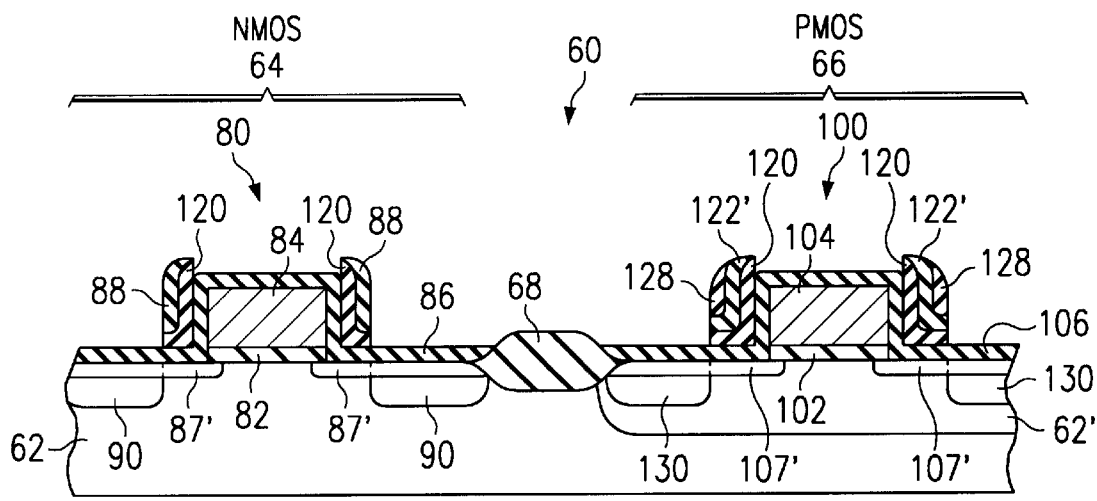
FIG. 2f illustrates the semiconductor device of FIG. 2e after the formation of additional sidewall spacers on each gate stack and after the implant of n-type and p-type deep source/drain regions.

FIG. 2f illustrates device 60 after the steps of FIG. 2e, and in FIG. 2f additional sidewall spacers 88 and 128 are formed in connection with gate stacks 80 and 100, respectively. More particularly, in the preferred embodiment, the mask from FIG. 2e is removed and an oxide layer (not fully shown) is formed over each gate stack 80 and 100. However, recall from FIG. 2e that prior to the addition of this oxide layer, there are two insulating layers 86 and 120 over gate stack 80, while there are three insulating layers 106, 120, and 122 (where layer 122 is then in the form of sidewall spacers 122') over gate stack 100. Thus, when the additional oxide layer is formed over both of these gate stacks 80 and 100, it overlies these previous layers. Preferably, the additional oxide layer is then anisotropically etched with a dry etch process, where the dry etch stops on the nitride from second insulating layer 120, thereby leaving nitride on top of each gate stack as well as on top of first insulating layers 86 and 106. Next, a timed or selective etch is performed to remove the nitride, thereby leaving spacers 88 and 128 on the sidewalls of gate stacks 80 and 100, respectively, and exposing first insulating layers 86 and 106 along the upper surface of substrate 62.

Continuing with FIG. 2f, once sidewall spacers 88 and 128 are formed, at one time one transistor area is masked while a dopant implant is performed for the un-masked transistor and, thereafter, the mask process is reversed and the implant is performed for the other transistor. For example, assume in a first instance that area 66 is masked, and then an n-type dopant (e.g., arsenic) is implanted in area 64. This n-type implant may be achieved using various parameters, such as with an energy on the order of 20 keV to 60 keV and a dopant concentration of $1E^{15}/cm^2$ to $3E^{15}/cm^2$. The n-type implant forms deep source/drain regions 90 self-aligned with respect to sidewall spacers 88. Next, in a second instance, area 64 is masked, and then a p-type dopant (e.g., $BF_2$) is implanted in area 66. This p-type implant may be achieved using various parameters, such as with an energy on the order of 20 keV to 60 keV and a dopant concentration of $1E^{15}/cm^2$ to $3E^{15}/cm^2$. Alternativley, if boron is used in lieu of $BF_2$, then the implant energy may be reduced relative to that for $BF_2$, where in the case of boron the energy may be on the order of 4 keV to 10 keV. In any event, the p-type implant forms deep source/drain regions 130 that are self-aligned with respect to sidewall spacers 128.

Figure 2G:
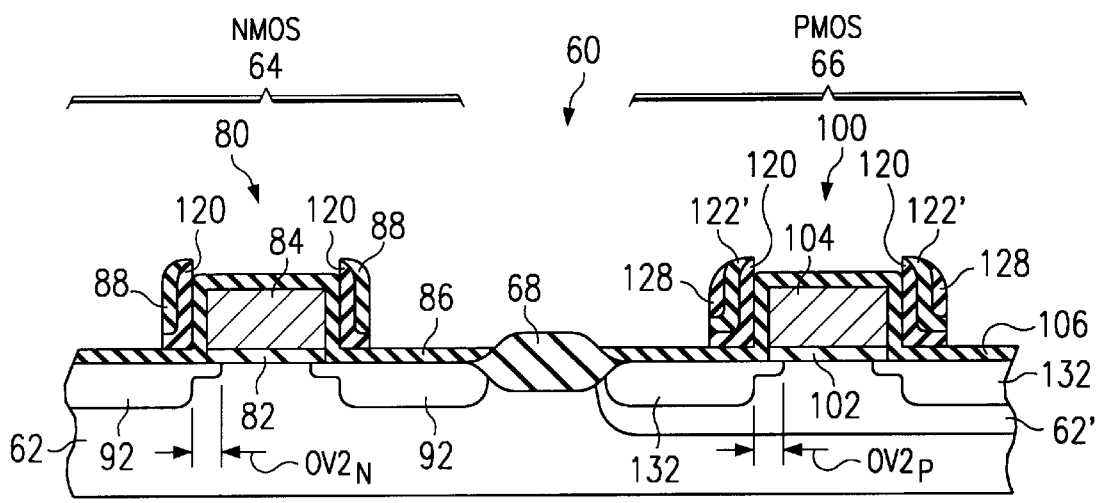
FIG. 2g illustrates the semiconductor device of FIG. 2f after an anneal of the p-type and n-type deep source/drain regions.

FIG. 2*f* illustrates device 60 after the steps of FIG. 2*f*, and in FIG. 2*g* an additional anneal is performed. The annealing step activates the dopants implanted to form deep source/drain regions 90 and 130. The anneal step may be achieved using various parameters, such as an RTA with a 950 to 1100° C. spike and for a desirable amount of time such as on the order of one to ten seconds. In response to the anneal, the dopants in deep source/drain regions 90 and 130 of FIG. 2*f* migrate laterally and they also further combine with HDD regions 87' and 107', respectively, from FIG. 2*f*. Thus, in FIG. 2*g*, the combination of regions 87' and 90 and regions 107' and 130 are shown for the NMOS transistor and PMOS transistor as regions 92 and 132, respectively. Thus, each of regions 92 and 132 includes a drain extension that extends under its corresponding gate. In addition to the preceding, note also that the above-described anneal also may affect HDD regions 87' and 107', such as by further diffusing those regions as well as further activating the dopants of those regions. Lastly, following the preceding steps, various other steps may be taken to form other aspects with respect to the PMOS and NMOS transistors, including other layers for connectivity and the like.

Having described the construction of device 60 through FIG. 2*g*, an additional observation is now made with respect to the desirable overlaps that are achieved by drain extensions in the preferred embodiment. Specifically, in FIG. 2*g*, the drain extension overlap for each transistor is shown, with the NMOS transistor having an overlap OV2N and the PMOS transistor having an overlap OV2P. Recall earlier that this document also described how it is desirable that prior art overlap OV1N and overlap OV1P are the same or similar, yet the prior art does not achieve this result. In contrast, note from FIG. 2*g* that overlap OV2N and overlap OV2P are either the same or very similar, even though the faster diffusing BF2 was used as a dopant for the PMOS transistor while the slower diffusing arsenic was used as a dopant for the NMOS transistor. This improved result is achieved because, prior to the anneal of HDD regions 87 and 107, they are physically implanted at differing distances relative to their respective gate sidewalls, but the subsequent anneal causes the BF2 to migrate a farther distance than the arsenic, thereby closing the relative distance gap originally caused by the implant. More particularly, HDD regions 87 are implanted at a location that is physically closer to the sidewall of gate 84 as compared to the location where HDD regions 107 are physically implanted relative to the sidewall of gate 104. Further, these different implant locations are due, in the preferred embodiment, to the use of a different number of sidewall layers at the time of the implant, that is, when HDD regions 107 are implanted, there are three sidewall layers along gate 104, whereas when HDD regions 87 are implanted, there are two sidewall layers along gate 84. Since each respective HDD region self-aligns in response to the number of insulating layers along the gate sidewall, then HDD regions 107 self-align at a location that is farther from gate 104 than the location where HDD regions 87 self align relative to gate 84. Ultimately, however, HDD regions 87 and 107 are both annealed. In response, HDD regions 107, formed from BF2, are anticipated to migrate laterally more than HDD regions 87, formed from arsenic. Note also that the same principles apply to the implant and subsequent anneal of the deep source/drain regions 90 and 130, that is, those regions are implanted at differing respective distances from gates 84 and 104, but they also are formed with dopants having differing migration rates in response to the subsequent anneal. As a result, therefore, following the anneal the overlap OV2N distance should be close to, or the same as, the distance of overlap OV2P. Thus, the combination of each HDD region and a corresponding deep source/drain region ultimately provides a controlled overlap for each drain extension.

From the above, it may be appreciated that the preferred embodiments provide an integrated circuit device with complementary transistor having controlled source/drain extensions that provide a comparable overlap for both transistors. Such a device and the formation of the device provides numerous advantages. As one advantage, there is described a method for achieving this result that does not require a reduction in the energy or dose in the $BF_2$ implant as is contemplated in the prior art. Accordingly, there is another advantage in that there also is not an increased $R_{SD}$ that exists in the prior art as a result of a reduced-energy or dose implant of $BF_2$. In other words, the preferred embodiment is able to achieve comparable drain extension overlap for both the PMOS and NMOS transistor where the dopant gradient in the drain extensions of the PMOS transistor is more favorable than what would be achieved by using a reduced-energy or dose implant of $BF_2$. As still another advantage, while the present embodiments have been described in detail, various substitutions, modifications or alterations could be made to the descriptions set forth above without departing from the inventive scope. For example, while p-type $BF_2$ has been described relative to n-type arsenic, the present teachings may be applied to other complementary conductivity type materials with differing migration rates. As another example, while the use of two versus three sidewall layers are described for locating the complementary HDD and deep source/drain implants at different locations relative to their respective gates, alternative approaches may be used to provide differing self-aligning locations of the complementary HDD and deep source/drain implants; however, in this regard, it is noted that the preferred method described above is relatively economical because the masking steps provided are already required in the fabrication of the transistors for other purposes and, thus, the preferred approach may be included with no additional masking step beyond what is already required in the prior art. As a final example, while various process parameters (e.g., energy, dose, temperature) have been specified herein, those values may be altered if desired. Thus, the many examples provided above, along with the preferred embodiments and the benefits arising from them, further illustrate the inventive scope, as is defined by the following claims.

What is claimed is:

1. A method of forming an integrated circuit device comprising a first transistor of a first conductivity type and a second transistor of a second conductivity type that is complementary to the first conductivity type, the method comprising the steps of:

forming a first gate stack, the first transistor comprising the first gate stack;

forming a second gate stack, the second transistor comprising the second gate stack;

implanting a first drain extension region at a first distance relative to the first gate stack, self-aligned to a thickness of insulating material including a first oxide layer, a nitride layer, and a second oxide layer along a sidewall of the first gate stack;

the first transistor comprising the first drain extension region;

implanting a second drain extension region at a second distance relative to the second gate stack, self-aligned to a thickness of insulating material including the first oxide layer, and the nitride layer along a sidewall of the second gate stack;

the second transistor comprising the second drain extension region; and the thickness of the insulating material along the sidewall of the first gate stack being larger than the thickness of the insulating material along the sidewall of the second gate stack, and the first distance being greater than the second distance.

2. The method of claim 1 wherein the integrated circuit device comprises a semiconductor substrate, and further comprising the step of forming the first oxide layer by re-oxidizing the semiconductor substrate.

3. The method of claim 2:

wherein the first transistor comprises a PMOS transistor; and the second transistor comprises an NMOS transistor.

4. An integrated circuit device comprising a first transistor of a first conductivity type and a second transistor of a second conductivity type that is complementary to the first conductivity type, the integrated circuit formed by the steps of:

forming a first gate stack, the first transistor comprising the first gate stack;

forming a second gate stack, the second transistor comprising the second gate stack;

implanting a first drain extension region at a first distance relative to the first gate stack, self-aligned to a thickness of insulating material including a first oxide layer, a nitride layer, and a second oxide layer along a sidewall of the first gate stack, the first transistor comprising the first drain extension region;

implanting a second drain extension region at a second distance relative to the second gate stack, self-aligned to a thickness of insulating material including the first oxide layer and the nitride layer along a sidewall of the second gate stack, the second transistor comprising the second drain extension region; and the first distance being greater than the second distance and the thickness of the insulating material along the sidewall of the first gate stack being larger than the thickness of the insulating material along the sidewall of the second gate stack.

\* \* \* \* \*